(12) United States Patent
Wang et al.

(10) Patent No.: US 9,460,887 B2
(45) Date of Patent: Oct. 4, 2016

(54) DISCHARGING METHOD FOR CHARGED PARTICLE BEAM IMAGING

(75) Inventors: You-Jin Wang, Milpitas, CA (US); Chung-Shih Pan, Palo Alto, CA (US)

(73) Assignee: HERMES MICROVISION, INC., Hsin-Chu (TW)

(*) Notice: Subject to any disclaimer, the term of this patent is extended or adjusted under 35 U.S.C. 154(b) by 290 days.

(21) Appl. No.: 12/468,026

(22) Filed: May 18, 2009

(65) Prior Publication Data
US 2010/0288923 A1    Nov. 18, 2010

(51) Int. Cl.
*H01J 37/28* (2006.01)
*H01J 37/02* (2006.01)

(52) U.S. Cl.
CPC ............ *H01J 37/02* (2013.01); *H01J 37/28* (2013.01); *H01J 2237/0041* (2013.01); *H01J 2237/0044* (2013.01)

(58) Field of Classification Search
CPC .......... H01J 2237/0044; H01J 37/26–37/2955
USPC ............................................... 250/306–311
See application file for complete search history.

(56) References Cited

U.S. PATENT DOCUMENTS

| | | | |
|---|---|---|---|
| 4,453,086 A * | 6/1984 | Grobman | 250/307 |
| 4,992,661 A * | 2/1991 | Tamura et al. | 250/307 |
| 5,288,368 A * | 2/1994 | DeMarco et al. | 216/66 |
| 5,717,204 A * | 2/1998 | Meisburger et al. | 250/310 |
| 5,976,328 A * | 11/1999 | Azuma et al. | 204/192.34 |
| 6,635,874 B1 * | 10/2003 | Singh et al. | 250/311 |
| 7,015,469 B2 * | 3/2006 | Wang et al. | 250/311 |
| 2004/0108067 A1 * | 6/2004 | Fischione et al. | 156/345.38 |
| 2005/0260419 A1 * | 11/2005 | Hukari et al. | 428/428 |
| 2006/0228897 A1 * | 10/2006 | Timans | 438/758 |
| 2008/0169433 A1 * | 7/2008 | Yasuda et al. | 250/492.3 |
| 2009/0017275 A1 * | 1/2009 | Lee et al. | 428/201 |

* cited by examiner

*Primary Examiner* — Robert Kim
*Assistant Examiner* — Eliza Osenbaugh-Stewart
(74) *Attorney, Agent, or Firm* — WPAT, PC; Justin King; Douglas A. Hosack

(57) ABSTRACT

A layer of conductive or semi-conductive material is formed on a surface of a sample and then the sample, when being charged particle beam imaged, is electrically coupled with an object having a large charge-receiving or charge-storage capacity (e.g., capacitance). Hence, the charging on the sample surface is removed and released quickly by the layer. The layer is then removed by reacting it with a predefined agent. The reaction forms a gaseous product which does not form a physical or chemical bond to the sample surface.

20 Claims, 5 Drawing Sheets

DISCHARGING METHOD FOR CHARGED PARTICLE BEAM IMAGING

FIELD OF THE INVENTION

The present invention relates to charged particle beam imaging and, more particularly, to a method for controlling surface charging of a sample during charged particle beam imaging.

BACKGROUND OF THE INVENTION

A conventional core charged particle beam imaging apparatus generally includes a primary charged particle beam source which generates a charged particle beam, a condenser lens to condense the generated charged particle beam, an objective lens to focus the charged particle beam into a fine probe, and a deflection unit to scan the fine probe over an area of a sample held on a stage. The charged particle beam probe (i.e., fine probe) interacts with the sample (at the scanned area) to excite secondary charged particles which carry information of local topography, material, and potential of the scanned area of the sample. A detection unit collects these secondary charged particles to form an image of the sample. One example of such a charged particle beam imaging technique is the scanning electron beam or scanning electron microscope (SEM).

In general cases, charging induced on the scanned area by the primary charged particle beam (i.e., fine probe) will accumulate if not released quickly. Though a proper level of charging of the sample is preferred to deliver a voltage contrast image, excessive and non-uniform charging will result in adverse effects on the image by distorting and/or defocusing the primary charged particle beam. This is especially a serious issue when the sample is insulative, such as with photolithography masks.

Currently, in some cases an approach to remove the sample surface charging is through use of a flood gun to intentionally project a separate charged particle beam, an optical beam or other electromagnetic radiation on the sample surface, so as to create a desired charging condition thereon. This operation is typically performed on a frame of image or wafer basis, i.e., it treats the sample surface in a large area at one time. However, with such an approach, when a subsequent imaging operation is performed, the established charging condition may have changed due to, for example, interaction of the regulated sample surface with the environment. In addition, this method requires an additional flood gun which has to be particularly designed to be integrated in the core imaging apparatus and operated in coordination with the imaging beam. This approach is disadvantageous and costly to both the system itself and its operation.

Another method of sample surface charging removal is through introduction of ionized gas molecules into the imaging room during imaging, so that charging on the sample surface can be neutralized by these charged particles. A potential drawback of this method is that the ionized gas molecules, although in small amount, can collide with and thus deviate the imaging beam, thereby damaging the quality of the obtained images. Further, this method also requires an additional gas ionizer and ionized gas molecule dispenser particularly designed to be integrated in the core imaging apparatus and operated in coordination with the imaging beam. This is again unfavorable from a cost point of view.

As mentioned above, the sample may be made of substantially insulative materials, such as, for example, with the mentioned photolithography masks. In such case, to release charging on the mask surface, physical contact with the sample to electrically couple it to ground is generally employed. However, as the imaging-induced charging is typically formed on the inspection area, which is a delicate pattern region on the mask surface, physical contact is undesired.

Accordingly, a method is needed for effectively releasing the sample surface charging without requiring the addition of extra mechanical hardware and/or operational software design to the core imaging apparatus.

SUMMARY OF THE INVENTION

A feature of this invention is to provide a method to release the sample surface charging for providing a stable, uniform, and sharp image during charged particle beam imaging.

Another feature of this invention is to enable effective surface charging regulation without major modifications, such as installation of extra hardware/software, to the core imaging apparatus.

In one embodiment of the present invention, a method for discharging a sample which is being charged particle beam imaged is disclosed. The disclosed method comprises forming a layer of conductive or semi-conductive material on the surface of the sample, and then, when the sample is being imaged, electrically coupling the sample to an object with a large capacity (e.g., capacitance) through the formed layer. The material is able to react with a predefined agent to form at least one gas molecule which does not form a physical or chemical bond to the sample surface.

DESCRIPTION OF THE EXEMPLARY EMBODIMENTS

Although the present invention will be described in accordance with the embodiments shown below, one of ordinary skill in the art will readily recognize that there can be variations to the embodiments, and those variations would be within the spirit and scope of the present invention. Accordingly, many modifications may be made by one of ordinary skill in the art without departing from the spirit and scope of the invention as defined by the appended claims.

Figure 1:
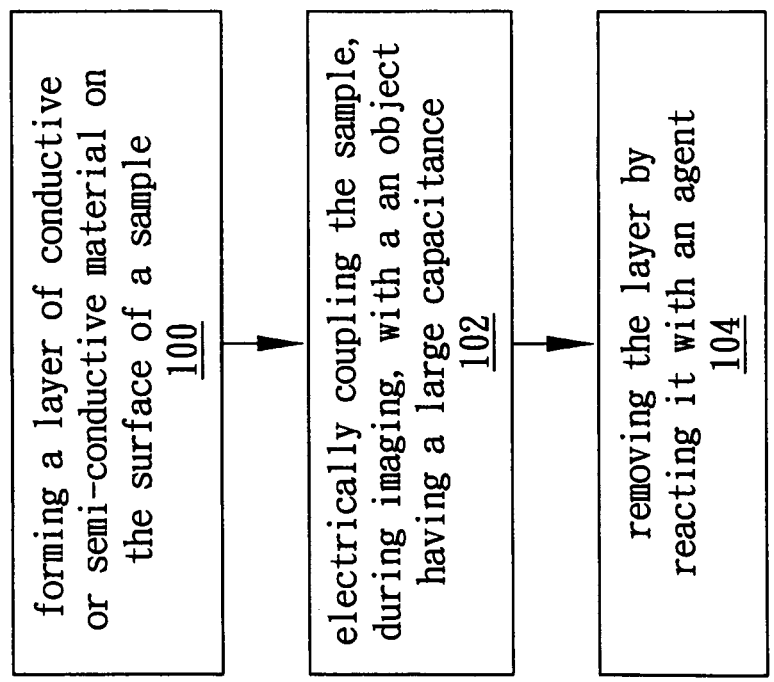
FIG. 1 is a flow chart illustration of a method for sample surface charging release during charged particle beam imaging in accordance with an embodiment of the present invention.

Referring to FIG. 1, a method for sample surface charging release during charged particle beam imaging is illustrated by way of a flow chart in accordance with an embodiment of the present invention. First, the method comprises forming a layer of conductive or semi-conductive material on the surface of a sample (step 100). The layer of conductive or semi-conductive material on the sample surface is formed to be a conductor for transferring charging on the sample surface away from the sample surface. The conductive or semi-conductive material on the sample surface may comprise carbon, graphite, carbon-nano tube, carbon powder, carbon nano-ribbon, carbon black, or any combination thereof. The layer thickness may be selected to be equal to or greater than 10 angstroms (Å). The layer of conductive or semi-conductive material may be formed on the sample surface by spin coating, physical vapor deposition, chemical vapor deposition, or any combination thereof.

Next, the method comprises electrically coupling the sample, during imaging, with an object having a large charge-receiving or charge-storage capacity (e.g., capacitance), such as ground, or the imaging system/machine itself, or anything whose potential does not change with the accumulating surface charging (step 102). A charging release path for the sample is formed by the layer of conductive or semi-conductive material on the sample surface and electrical connection therefrom and eventually to the large capacitance object. Details of the electrical connection mechanism will be described below. As long as the capacitance of the object is large enough to accept charging on the sample surface, a virtual grounding effect is provided, and charging on the sample surface can be quickly released through this charging release path. According to a feature of the present invention, by operation of this connection, charging (e.g., surface charging) on the sample can be quickly released (e.g., conducted away) during charged particle beam imaging, leaving the core system mechanical design and operational settings substantially unchanged.

Further, as the sample surface is covered by the conductive or semi-conductive layer, direct physical contact with the inspection area is not necessary. Instead, the contact can be made at the peripheral margin area of the sample surface. Charging on the inspection area can be conducted through the formed conducting layer on the sample to the peripheral margin area and then released through the charging release path.

After imaging, the layer of conductive or semi-conductive material on the sample surface is removed (step 104). In this step, an agent is introduced to react with the conductive or semi-conductive material on the sample surface until all of the conductive or semi-conductive material on the sample surface is fully reacted. In particular, the material is selected to be able to react with the agent to form at least one gas molecule which does not form a physical or chemical bond to the sample surface. As a result, the product gas molecules do not attach to the sample surface and can be removed easily. Then, the gas molecules are exhausted and the conductive or semi-conductive material on the sample surface is removed without residual material on the sample surface. In one embodiment, the agent comprises oxygen or air. The air may be room air or compressed air. In one embodiment, before reacting with the layer, the agent is pretreated with a high energy particle or radiation, for example plasma or laser. This is to transform the agent to a more reactive form, for example, single atoms, ions, or radicals. Therefore, the agent, during reaction, is provided in the form of single atoms, ions, radicals, or combination thereof.

Figure 2:
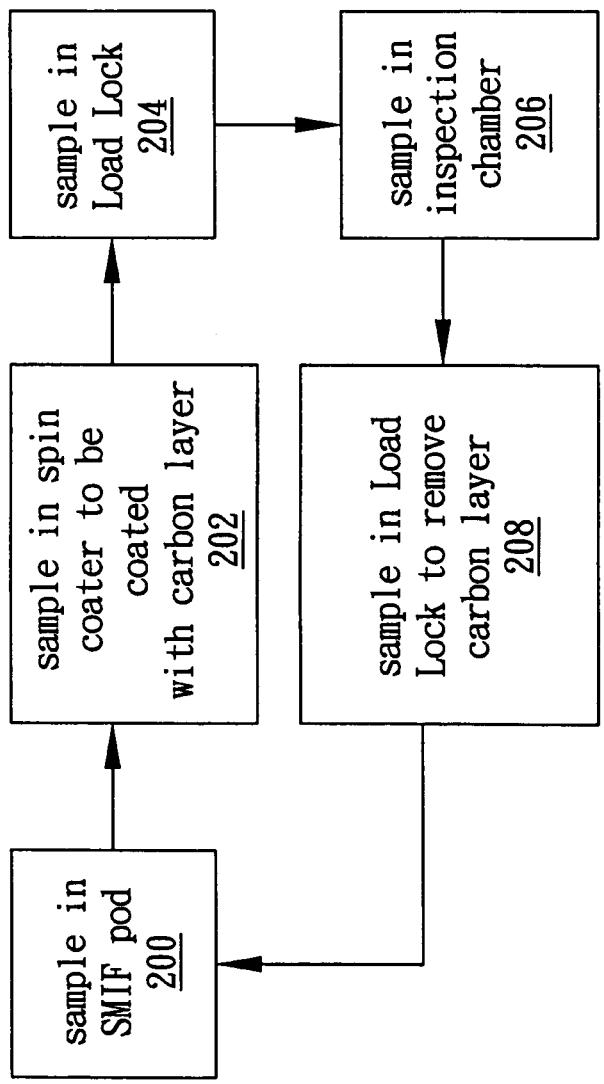
FIG. 2 is a block diagram illustrating execution of a method for sample surface charging release during charged particle beam imaging in accordance with an embodiment of the present invention.
Figure 3A:
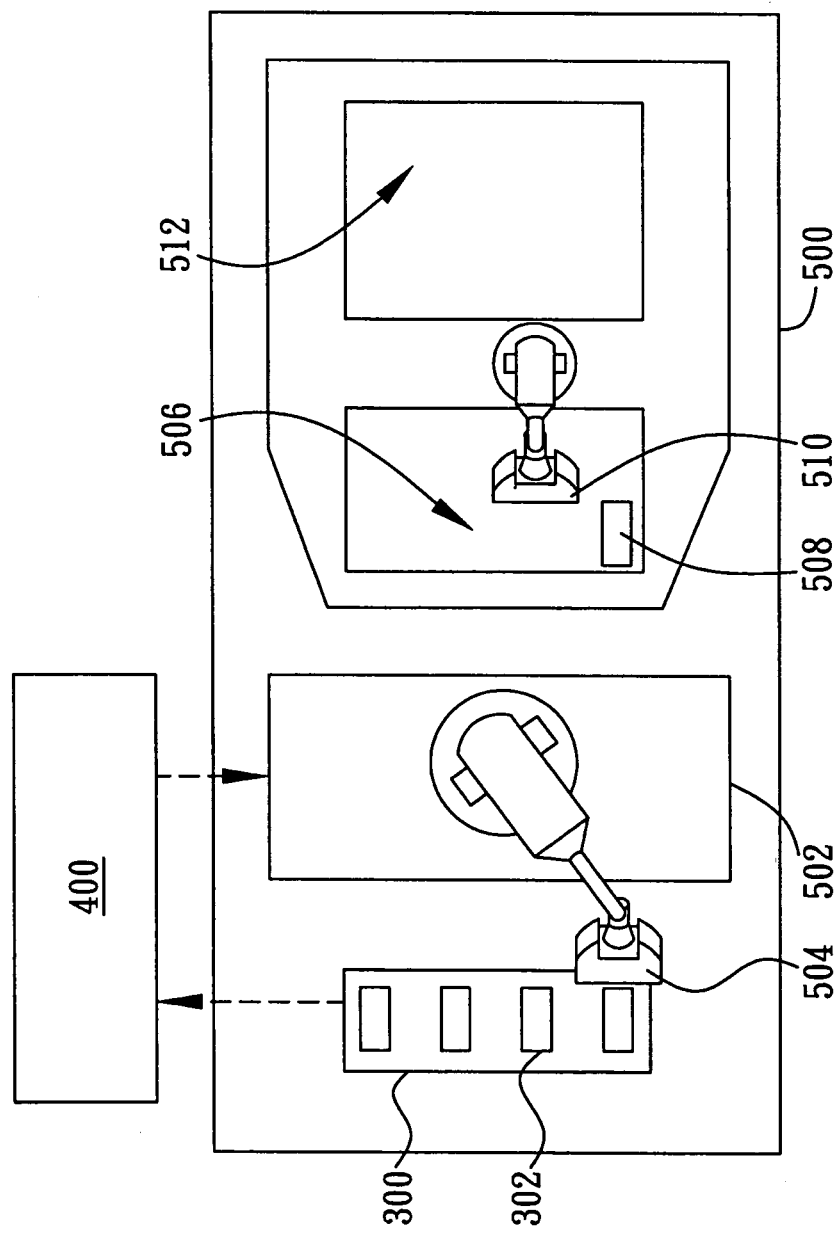
FIG. 3A and FIG. 3B are top views of scanning electron microscopes (SEMs) in accordance with embodiments of the present invention.
Figure 3B:
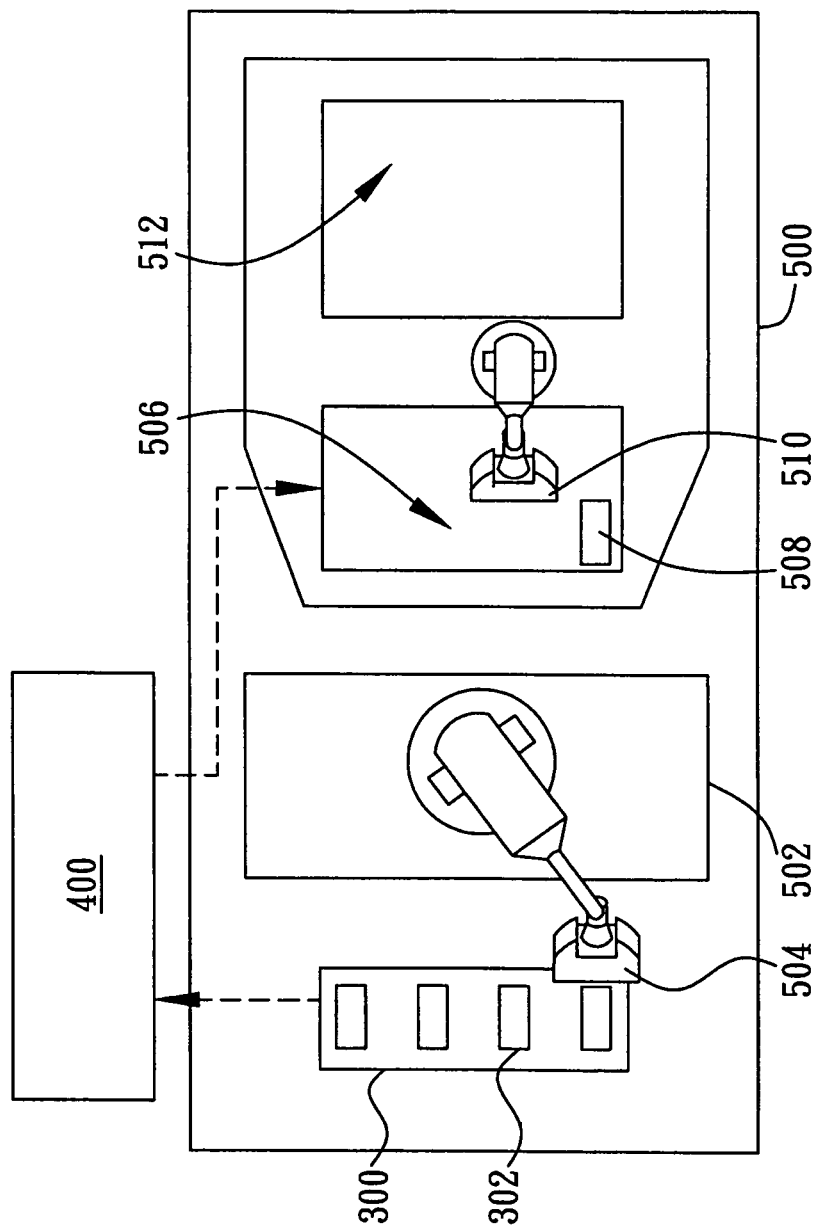
Figure 4:
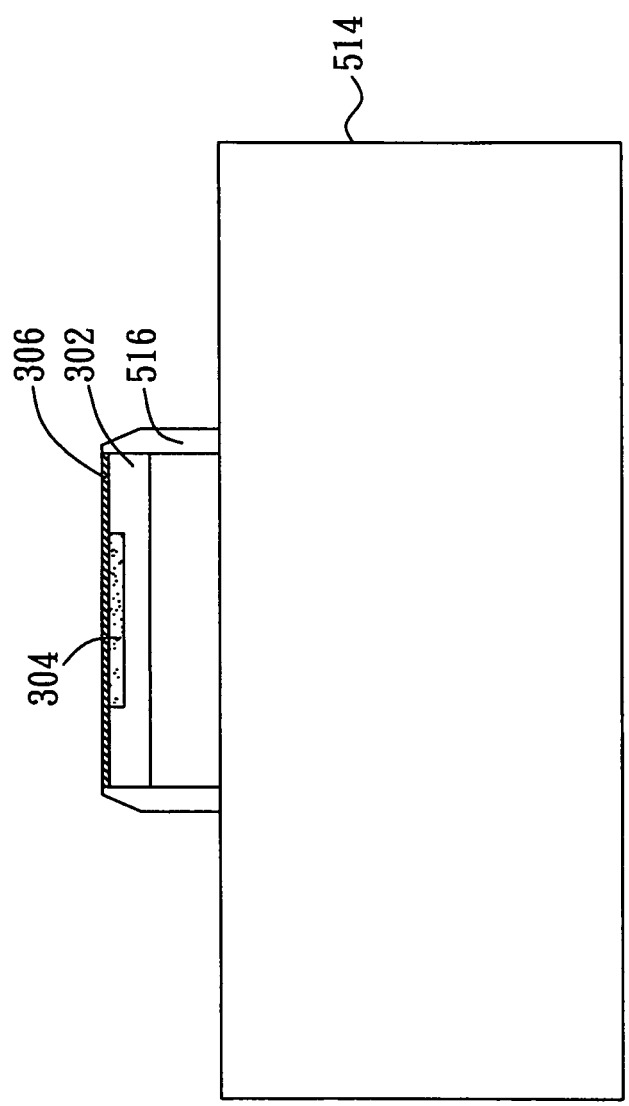
FIG. 4 is a side view of a sample being secured on a stage for charged particle beam imaging in accordance with embodiments of the present invention.

Referring to the combination of FIG. 2, FIG. 3A, FIG. 3B and FIG. 4, FIG. 2 is a block diagram illustrating execution of a discharging method in accordance with an embodiment of the present invention, FIGS. 3A and 3B are top view diagrams of a scanning electron microscope (SEM) system 500, and FIG. 4 is a side view of a sample being secured on a stage for charged particle beam imaging in accordance with an embodiment of the present invention. FIGS. 3A, 3B and 4 are for assisting in interpreting the operation illustrated in FIG. 2. It is noted that the dotted arrows in FIGS. 3A and 3B indicate the moving path of the sample relative to the inspection chamber (which is denoted 512 in FIGS. 3A and 3B). The return path from the inspection chamber is not illustrated in FIG. 3A and FIG. 3B.

First, in step 200, samples 302 (photolithography mask in this embodiment) are put in a SMIF pod (Standard Machine InterFace pod) 300. Next, sample 302 is transferred into a spin coater 400 where a layer of carbon powder or carbon is coated on the surfaces of sample 302 (step 202). It is noted that the coating can be made to cover only the designated surfaces of sample 302. For example, in the case sample 302 being a photolithography mask having a cuboid shape, the carbon layer can be made to cover only the top surface, side surfaces or bottom surface of the mask, or combination thereof. The thickness of the carbon layer may be selected to be equal to or greater than 10 Å. In this embodiment, it is selected to be about 20 Å. After coating, sample 302 with the carbon layer is transferred into a load chamber 502 of the scanning electron microscope system 500 as shown in FIG. 3A, and then is transferred into load lock 506 of scanning electron microscope system 500 by robotic arm 504, and a vacuum environment is created in load lock 506 by a vacuum pump (step 204).

After the vacuum environment is created, sample 302 is transferred from the load lock 506 into the main inspection chamber (or imaging room) 512 by a robotic arm 510, and then, imaging/inspection is performed (step 206). After sample 302 is transferred into main chamber 512, it is held on a stage 514 in the main chamber 512 by a rack 516, as shown in FIG. 4. Rack 516 is made of a conductive material such as metal, and sample 302, especially carbon layer 306 on the sample surface, is arranged to be in contact with rack 516. It is noted that in this embodiment carbon layer 306 covers a pattern region 304 of sample 302 which is the main inspection area. Also, carbon layer 306 covers the peripheral margin region of sample 302 which surrounds pattern region 304. Therefore, charging formed on pattern region 304 during imaging is able to be transferred to the margin region by carbon layer 306 and eventually to rack 516. Carbon layer 306 can be formed also on the side surfaces of sample 302, such that the top and side surfaces of sample 302 are electrically connected, and then electrically connected to rack 516 as well. In either case, sample 302 can be electrically coupled with stage 514 (or say scanning electron microscope system 500) through layer 306 and rack 516, and the charging formed on the sample surface during imaging can be transferred to stage 514 or scanning electron microscope system 500 quickly. Stage 514 or scanning electron microscope 500 has a large capacitance which would not be affected by the charging from the sample surface, thus it can serve as ground. As would be understood by those skilled in the art, alternatives and variants of the above described electrical connection mechanism are possible. For example, the sample can be made to be in direct contact with the stage. In this case, the carbon layer must be formed to cover, for example, the entire sample, such that charging on the top surface of the sample can be conducted to the bottom surface of the sample and released through the stage.

After imaging, sample 302 is transferred from main inspection chamber 512 to load lock 506 by robotic arm 510, and then an agent is introduced into load lock 506 for reacting with carbon layer 306 (step 208). In this embodiment, the agent comprises oxygen. In one embodiment, before reacting with layer 306, a plasma is generated by a plasma generator 508 in the load lock 506, and the agent is pretreated by the plasma to be decomposed to the form of oxygen atoms or radicals. Generated oxygen atoms/radicals then react with carbon layer 306, forming a gas of carbon monoxide (CO) and/or carbon dioxide ($CO_2$) by the following formulas:

$$C+O=CO(g)$$

$$CO+O=CO_2(g)$$

An example mechanism is as the following:

$$O+O=O_2$$

$$O+O_2=O_3$$

$$C+O_3=CO+O_2$$

Therefore carbon layer 306 is removed. The formed gas of carbon monoxide/carbon dioxide is a stable gas. Therefore, it does not form physical or chemical bonding of any kind to the sample surface and thus can be exhausted away from scanning electron microscope system 500 easily. It is noted that with the above case presented, other combinations of conductive/semi-conductive materials with a corresponding removing agent(s) are possible as variants or alternatives of the present invention. The feature of the present invention is to transform the coating layer on the sample surface into a gaseous product by reacting it with a suitable agent. The gaseous product should not be adhesive to the sample surface in any way such that it can be easily exhausted and removed. The embodiment illustrated in FIG. 2 is merely for example and should not be used to limit the scope of the present invention, which is to be defined by the claims included herein.

After removing layer 306, sample 302 is transferred back into SMIF pod 300, and another sample in SMIF pod 300 is taken out for imaging by repeating step 202 to step 208.

In one embodiment of the present invention, after coating, sample 302 with carbon layer 306 is directly transferred into load lock 506, as shown in FIG. 3B.

By way of the above-mentioned steps, a layer of conductive or semi-conductive material is formed on a sample (especially an insulative sample), enabling the sample to be electrically coupled to an external object. The object can be selected to have a large capacitance to enable effective surface charging regulation of the sample when being charged particle beam imaged/inspected. During imaging/inspection, the charging on the sample surface will be released into the high capacitance object (ground) quickly through the layer of conductive or semi-conductive material. Therefore, effective surface charging regulation is provided without major modification, such as installation of extra hardware/software, to the core imaging apparatus.

What is claimed is:

1. A method for reversibly enhancing dispersion of charge from a sample for charged particle beam inspection, comprising:
    transferring said sample from a standard machine interface pod (SMIF) to a spin coater;
    spin coating a conductive layer on a sample surface of said sample;
    transferring said sample from the spin coater to a load lock of a scanning electron microscope system;
    forming a vacuum around said sample;
    transferring said sample to an electrically grounded rack in a main inspection chamber so that the conductive layer contacts the electrically grounded rack;
    inspecting said sample on said electrically grounded rack with charged particle beam inspection;
    transferring said sample from the electrically grounded rack to the load lock;
    generating a high energy plasma with a plasma generator in the load lock;
    introducing a first gaseous agent into the load lock;
    pretreating the first gaseous agent with the high energy plasma to create an activated gaseous agent in the load lock; and
    exposing the conductive layer to the activated gaseous agent in the load lock until all of the conductive layer reacts to form reaction gases.

2. The method of claim 1, wherein said conductive layer comprises carbon, graphite, carbon-nano tube, carbon powder, carbon nano-ribbon, or carbon black.

3. The method of claim 1, wherein the thickness of the said conductive layer is equal to or greater than 10 angstroms (Å).

4. The method of claim 1, wherein said first gaseous agent comprises gaseous oxygen or air.

5. The method of claim 1, wherein said transferring said sample to said electrically grounded rack is performed using a robotic arm.

6. The method of claim 1, wherein said transferring said sample from said electrically grounded rack to said load lock is performed using a robotic arm.

7. The method of claim 1, wherein said sample is made of substantially insulative materials.

8. The method of claim 1, further comprising exhausting said reaction gases from said load lock.

9. The method of claim 1, wherein said sample is a mask for lithography.

10. The method of claim 1, wherein the thickness of said conductive layer is greater than 10 angstroms (Å) and less than 200 angstroms (Å).

11. A method for reversibly enhancing dispersion of charge from a sample for charged particle beam inspection, comprising:
    forming a conductive layer of conductive or semi-conductive material on a sample surface of said sample wherein said conductive material is able to react with a gaseous agent to form at least one gas molecule which does not form physical or chemical bonding to said sample surface;
    electrically coupling said conductive layer through an electrically grounded rack, during charged particle beam inspection, with an object having a large capacitance through said layer; and
    introducing said gaseous agent into a load lock after charged particle beam inspection to react with said conductive layer until all of said conductive layer is fully reacted.

12. The method of claim 11, wherein said material comprises carbon, graphite, carbon-nano tube, carbon powder, carbon nano-ribbon, carbon black, or any combination thereof.

13. The method of claim 11, wherein the thickness of said conductive layer is greater than 10 angstroms (Å) and less than 200 angstroms (Å).

14. The method of claim 11, wherein said agent comprises gaseous oxygen, air, or compressed air.

15. The method of claim 11, wherein said gaseous agent is in the form of atoms, ions, or radicals.

16. The method of claim 11, wherein said conductive layer is formed on said sample surface by spin coating.

17. The method of claim 11, wherein said sample is made of substantially insulative materials.

18. The method of claim 11, wherein said agent is pretreated with a high energy particle or irradiation.

19. The method of claim 11, wherein said sample is a mask for lithography.

20. The method of claim 1, wherein the thickness of said conductive layer is greater than 10 angstroms (Å) and less than 100 angstroms (Å).

* * * * *